(12) United States Patent
Nadeau-Dostie et al.

(10) Patent No.: US 7,370,251 B2
(45) Date of Patent: May 6, 2008

(54) METHOD AND CIRCUIT FOR COLLECTING MEMORY FAILURE INFORMATION

(75) Inventors: Benoit Nadeau-Dostie, Gatineau (CA); Jean-François Côté, Chelsea (CA)

(73) Assignee: LogicVision, Inc., San Jose, CA (US)

( * ) Notice: Subject to any disclaimer, the term of this patent is extended or adjusted under 35 U.S.C. 154(b) by 804 days.

(21) Appl. No.: 10/690,594

(22) Filed: Oct. 23, 2003

(65) Prior Publication Data

US 2005/0047229 A1 Mar. 3, 2005

(30) Foreign Application Priority Data

Dec. 18, 2002 (CA) .................................. 2414632

(51) Int. Cl.
*G11C 29/00* (2006.01)
(52) U.S. Cl. ..................................... 714/723
(58) Field of Classification Search ................ 714/723
See application file for complete search history.

(56) References Cited

U.S. PATENT DOCUMENTS

| | | | | |
|---|---|---|---|---|
| 5,912,901 | A * | 6/1999 | Adams et al. ............... | 714/733 |
| 5,961,653 | A * | 10/1999 | Kalter et al. .................... | 714/7 |
| 6,269,455 | B1 | 7/2001 | Deas | |
| 6,286,115 | B1 * | 9/2001 | Stubbs ....................... | 714/718 |
| 6,324,657 | B1 | 11/2001 | Fister et al. | |
| 6,421,794 | B1 * | 7/2002 | Chen et al. .................... | 714/42 |
| 6,496,947 | B1 * | 12/2002 | Schwarz ...................... | 714/30 |
| 6,550,023 | B1 | 4/2003 | Brauch et al. | |
| 6,643,807 | B1 * | 11/2003 | Heaslip et al. .............. | 714/719 |

FOREIGN PATENT DOCUMENTS

WO WO 01/67463 A1 9/2001

OTHER PUBLICATIONS

Chen et al., "Enabling Embedded Memory Diagnosis via Test Response Compression", 19th IEEE VLSI Test Symposium (VTS 2001).
Schanstra et al., Semiconductor Manufacturing Process Monitoring using Built-In Self-Test for embedded Memories, 1998 ITC Proceedings.
Chen et al., "Test Response Compression and Bitmap Encoding for Embedded Memories in Manufacturing Process Monitoring", 2001 ITC Proceedings. p. 258.

* cited by examiner

*Primary Examiner*—James C. Kerveros
(74) *Attorney, Agent, or Firm*—Eugene E. Proulx; Dennis S. K. Leung

(57) ABSTRACT

A method and circuit for collecting memory failure information on-chip and unloading the information in real time while performing a test of memory embedded in a circuit comprises, for each column or row of a memory under test, testing each memory location of the column or row according to a memory test algorithm under control of a first clock, selectively generating a failure summary on-circuit while testing each column or row of the memory; and transferring the failure summary from the circuit under control of a second clock within the time required to test the next column or row, if any, of the memory under test.

54 Claims, 15 Drawing Sheets

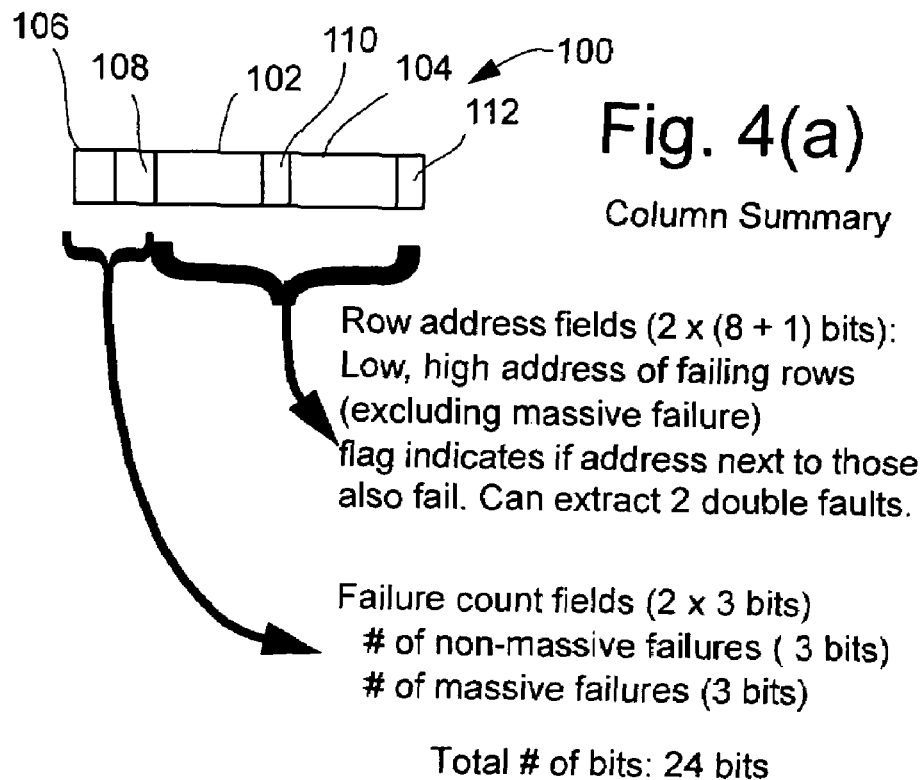

Fig. 4(a)
Column Summary

Row address fields (2 x (8 + 1) bits):
Low, high address of failing rows
(excluding massive failure)
flag indicates if address next to those also fail. Can extract 2 double faults.

Failure count fields (2 x 3 bits)
 # of non-massive failures ( 3 bits)
 # of massive failures (3 bits)

Total # of bits: 24 bits

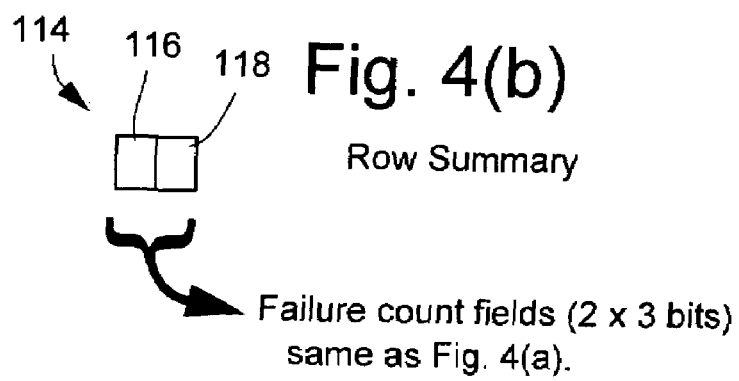

Fig. 4(b)
Row Summary

Failure count fields (2 x 3 bits)
same as Fig. 4(a).

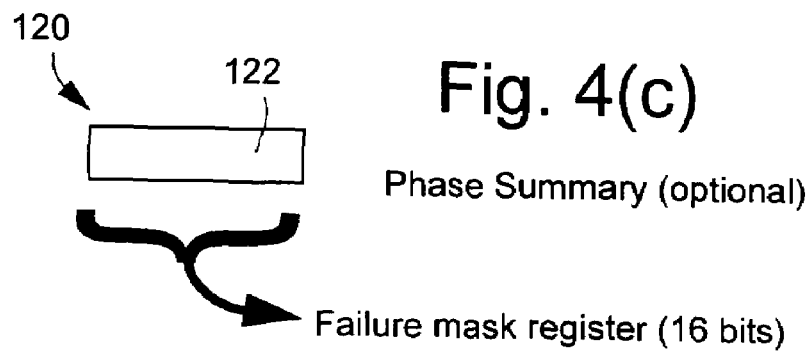

Fig. 4(c)
Phase Summary (optional)

Failure mask register (16 bits)

Column Summary

GOID fields (16 bits):
GOIDs for entire column (16 bits) encoded or not

Failure count fields (2 x 3 bits)
# of non-massive failures ( 3 bits)
# of massive failures (3 bits)

Total # of bits: 22 bits

Row Summary

Failure count fields (1 x 3 bits)
# of failures ( 3 bits)

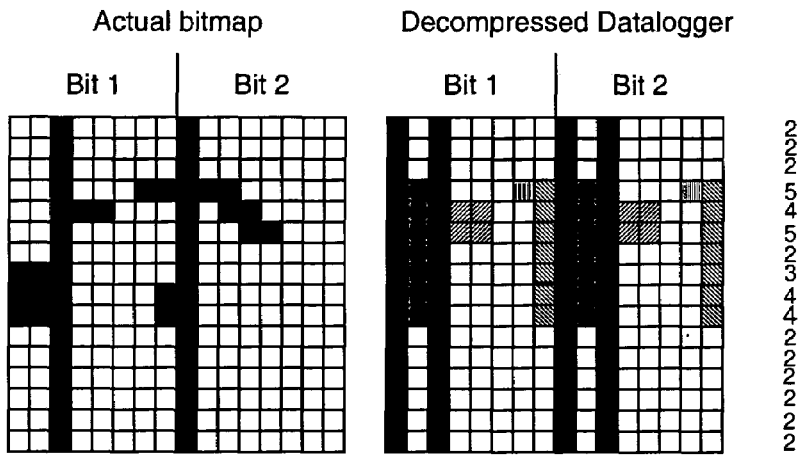

Fig. 14(a).

Actual bitmap / Decompressed Datalogger

Pass 1
Fig. 14(b).

Area in dashed circled requires the row summary to resolve. All other portions only require column summary.

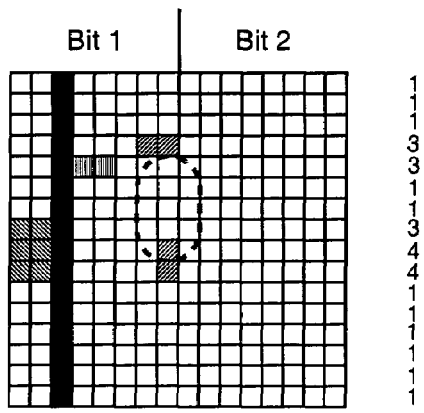

Pass 2, Bit 1
Fig. 14(c).

All failures for Bit 2 are resolved with the column summary

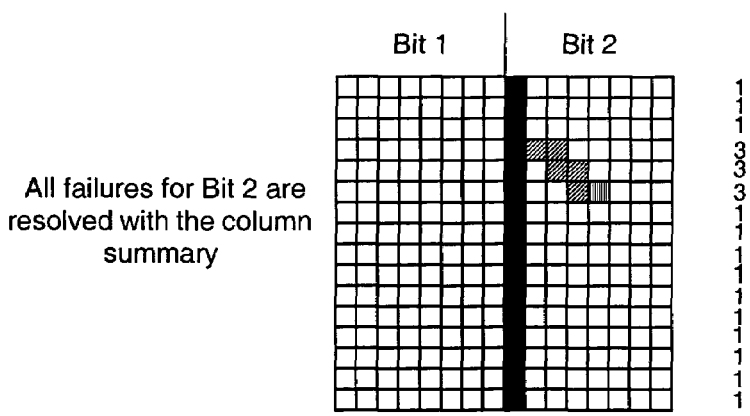

Pass 2, Bit 2
Fig. 14(d).

☐ no fail
▦ 1 fail area
▨ 2 fail area
▧ 3 fail area
■ 3< X <25% fail area — Code 4
▨ 25%< X <50% fail area — Code 5
☐ 50%< X <100% fail area — Code 6
■ 100% fail area — Code 7

X - No. of Failures

| Column Number | Pass 1 | Pass 2 Bit 1 | Pass 2 Bit 2 |
|---|---|---|---|
| 0 | 7\|0\|00\|1\|FF\|1 | 3\|0\|07\|1\|09\|1 | 7\|0\|00\|1\|FF\|1 |
| 1 | 4\|0\|03\|0\|09\|1 | 3\|0\|07\|1\|09\|1 | 1\|0\|03\|0\|03\|0 |
| 2 | 7\|0\|00\|1\|FF\|1 | 7\|0\|00\|1\|FF\|1 | 2\|0\|03\|1\|04\|1 |
| 3 | 2\|0\|04\|1\|05\|1 | 1\|0\|04\|0\|04\|0 | 2\|0\|04\|1\|05\|1 |
| 4 | 2\|0\|04\|1\|05\|1 | 1\|0\|04\|0\|04\|0 | 1\|0\|05\|0\|05\|0 |
| 5 | 0\|0\|00\|0\|00\|0 | 0\|0\|00\|0\|00\|0 | 0\|0\|00\|0\|00\|0 |
| 6 | 1\|0\|03\|0\|03\|0 | 1\|0\|03\|0\|03\|0 | 0\|0\|00\|0\|00\|0 |
| 7 | 3\|0\|03\|0\|09\|1 | 3\|0\|03\|0\|09\|1 | 0\|0\|00\|0\|00\|0 |

Fig. 14(e)

| Pass 1 | Pass 2 Bit 1 | Pass 2 Bit 2 |
|---|---|---|
| 0110000000000000 | 0100000000000000 | 0010000000000000 |

Fig. 14(f)

METHOD AND CIRCUIT FOR COLLECTING MEMORY FAILURE INFORMATION

BACKGROUND OF THE INVENTION

1. Field of the Invention

The present invention relates, in general, to testing of integrated circuits, and, more specifically, to a method of collecting in real time memory failure information for memories tested using an embedded memory test controller.

2. Description of Related Art

Memory failure information can be used to monitor and improve the quality of an integrated circuit manufacturing process. This is done by diagnosing and correlating functional failures to defects in the circuit introduced during manufacturing. The defects can in turn be associated with a certain step of the manufacturing process. Modifications can be made to this manufacturing step by using different settings for temperature, duration, dust control, and the like. If these modifications are not sufficient or possible, the circuit design might have to be changed to be more tolerant of this type of defect. One type of design modification is the introduction of redundant memory cells that can be substituted for defective memory cells.

Conventional diagnosis methods transfer detailed information about all failures off-chip to a tester for analysis. It is difficult or even impossible to do so in real time because of the bandwidth required. There are two aspects of the bandwidth problem.

A first aspect relates to the amount of information to be sent. One bit of information is required for every memory bit read. Memories often have a large number of bits (16 to 256) that are read simultaneously. This number of bits is multiplied by the number of words and by the number of read operations. This large amount of detailed information could be transferred off-chip by means of a large number of pins corresponding to the number of bits in a word. However, it is not desirable or even possible to do so. As is well known in the art, it is important to minimize the number of pins in order to reduce test cost.

A second aspect of the bandwidth problem relates to the rate at which the detailed information can be exported to a tester. Memories now operate at clock rates that exceed tester interface clock rates and is one of the reasons why embedded test controllers are used to perform memory testing. Embedded test controllers can determine whether a memory is good or bad. However, raw detailed failure information cannot be transferred without transformation because the information is generated faster than a tester can accept. One possible solution is to use a demultiplexer to reduce the rate of transfer to the tester. However, this requires multiplying the number of pins used to transfer the failure information by the ratio of the memory clock rate to the tester interface clock rate. This ratio can be as high as 10.

FIG. 1 illustrates an example of a simple memory 10 which contains defects indicated by black squares. Memory 10 contains four bit words. The bits are organized into bit arrays, labeled Bit 0 through Bit 3, comprised of eight columns and 16 rows, providing 128 words (8 columns times 16 rows) of four bits each for a total of 512 bits. The rows are arranged into two segments, labeled Segment 1 and Segment 2. Each bit of an array is accessed by applying a row address to a row decoder 12 and a column address to a column decoder 14. Four bits are used to access one of the 16 rows and three bits are used to access one of the eight columns of each bit-array. Several memories can be grouped together to form a larger memory. Individual memories are designated as banks. Banks can be used to increase the width of the memory, i.e. to add more bits per word. In this case, no additional address bits are necessary. Banks can also be used to increase the depth of the memory, i.e., to add more words. If the memory included banks, bank address bits would be used to select which bank is accessed. It will be understood by those skilled in the art that memories usually have many more rows, columns and banks than that shown in the figure and indicated above. Memory 10 illustrates one of several memory architectures and access mechanisms.

FIG. 2 shows a representative set of failure patterns that are of interest from a process monitoring point of view because each pattern can be associated with the presence of specific defects. Failure patterns generally consist of single cell failures, 2-cell failures, partial/full/two column failures and row failures. Other classifications are possible.

Chen et al, in a paper entitled "Enabling Embedded Memory Diagnosis via Test Response Compression", 19th IEEE VLSI Test Symposium (VTS 2001) (see also Chen et al. PCT Patent Application WO 01/67463 A1 published on Sep. 13, 2001 for "Method and Apparatus for Diagnosing Memory using Self-Testing Circuits"), disclose a compression technique which uses a 6-bit output per group of fail vector. Bits of the fail vectors are combined in various ways along rows (AND, OR, 2OR (2 or more failures in the word)), columns (MaskedAND, MaskedOR, Repeat) and diagonals (XOR). Primary disadvantages of the method are that the method requires high-speed outputs, and the complexity of the functions requires splitting a fail vector into many groups, thereby increasing the number of pins that need to be connected to a tester.

Schanstra et al., in a paper entitled "Semiconductor Manufacturing Process Monitoring Using BIST for Embedded Memories" and published in the Proceedings of the International Test Conference, Oct. 18-23, 1998, disclose a method which uses several registers to collect failure information during the execution of a memory test. The registers are only inspected and exported at the end of the memory test. The registers include a fault counter, a column fault capture unit, and an address capture unit for isolated faults. The drawbacks of this method are that it does not capture information respecting faulty rows and the results of a column fault capture unit are corrupted in the presence of faulty rows. The method is restricted to algorithms that use column access mode only and requires too many registers because the test controller must accumulate the failure information until the end of the test instead of sending failure information as it is available, i.e., in real time.

Clearly, a different method is needed to compress failure information that needs to be transferred without sacrificing the ability of extracting relevant failure information. The level of resolution of the information can be traded off based on the application for which the information is required. For example, for yield analysis, it is sufficient to know the failure density (e.g., the number of failures in a column or row) for any density of failures, whereas, for repair analysis, it is necessary to know the location of individual failures more precisely when the density is low. The method of the present invention supports such trade-off. As will be seen, the present invention takes advantage of the memory structure and certain characteristics of conventional memory tests to generate failure summaries.

SUMMARY OF THE INVENTION

The present invention seeks to provide a method of collecting memory failure information in real time for memories tested using an embedded memory test controller for the purpose of process monitoring, yield enhancement, redundancy analysis and bitmap generation.

An objective of the method of the present invention is to provide an embedded test infrastructure for transferring compressed failure information off-chip at a tester clock rate in real time while performing a memory test at a system clock rate. The method allows a trade-off between the number of failure patterns that can be classified according to a classification, such as those shown in FIG. 2, the amount of on-chip circuitry required to do so, and any additional amount of test time required to perform the classification.

According to a first broad aspect of an embodiment of the present invention there is disclosed a method for collecting memory failure information in real time while performing a test of memory embedded in a circuit, comprising, for each column or row of a memory under test, the steps of: (a) successively conducting uninterrupted testing of each memory location of said column or row according to a memory test algorithm under control of a first clock; (b) selectively generating a failure summary on-circuit while continuing to perform said uninterrupted testing of each memory location of said column or row; and (c) transferring off-circuit said failure summary from said circuit under control of a second clock concurrently with uninterrupted testing of a next column or row in sequence.

According to a second broad aspect of an embodiment of the present invention there is disclosed a method of collecting memory failure information in real time while performing a test of memory embedded in a circuit for memory test phases that use a column or a row access mode, comprising, for each memory column or row under test: testing each memory location of said column or row according to a memory test algorithm under control of a first clock; generating on-circuit a failure summary while testing said column or row, said generating a failure summary including, for each detected failure; determining whether said detected failure is a massive failure or a non-massive failure; and, if said detected failure is a non-massive failure: classifying said detected failure according to predetermined failure types; and updating a failure mask register with results of comparisons of memory outputs and expected memory outputs; incrementing a count of each detected failure type; and storing the row or column address of the first and last failures in said column or row, respectively; upon completion of testing of said column or row, selecting a failure summary data depending upon whether a column or row was tested; and transferring said failure summary from said circuit under control of said second clock concurrently with testing of the next column or row in sequence.

According to a third broad aspect of the embodiment of the present invention, there is disclosed a memory test controller for testing a memory in a circuit, comprising means for conducting testing of each memory location of a column or row of said memory according to a test algorithm under control of a first clock in uninterrupted fashion; means for generating a failure summary while testing the column or row of said memory; and means for transferring said failure summary from said circuit via a circuit output under control of a second clock while testing a next column or rows if any, of a memory under test.

According to a fourth broad aspect of an embodiment of the present invention, there is disclosed a memory test controller for testing memory in a circuit, comprising: means for testing each memory location of a column or row of a memory under test according to a test algorithm under control of a first clock; a failure summary generator for generating a failure summary while testing a column or row of said memory, including: failure type identification means responsive to a failure mask for classifying detected failures according to predetermined failure types; counter means responsive to outputs of said failure type identification means for counting failures of each said predetermined types; failure address registers for storing the row or column address of first and last detected failures in a column or row under test; and a failure mask register for storing a failure mask containing results of comparisons of memory data outputs against expected data outputs; means responsive to phase input signals and memory access mode signals for selecting failure data to insert into said failure summary a failure summary transfer register having a bit length equal to or less than the time required to test a column or row of said memory divided by the period of said second clock; and means for transferring said failure summary from said circuit via a circuit serial output under control of a second clock while testing the next column or row, if any, of a memory under test.

In a preferred embodiment of the method of the present invention, a failure summary is generated for each column during memory test phases that use a column access mode and for each row during memory test phases that use a row access mode. Memory test phases are executed at a first clock rate. Failure summaries are transferred from a memory test controller to an external tester at a second, lower, clock rate. Failure summary transfers are synchronized with the beginning of each column or row test phase and are performed concurrently with the memory test. While a test is being performed, detected failures are categorized into failure types and a count of each type of failure is maintained. Failure address registers store the row or column address of selected failures. A test mask register indicates which memory data outputs failed a comparison with an expected data value during execution of a test on a column or row. The test mask register is initialized at the beginning of each column, in column access mode, or row, in row access mode. Failure summaries include a combination of address information, failure count information and failure mask register information. Certain fields of information may be encoded to minimize the amount of information to transfer.

BRIEF DESCRIPTION OF THE DRAWINGS

These and other features of the invention will become more apparent from the following description in which reference is made to the appended drawings in which:

FIG. 4(a) to 4(c) illustrate a first example of a failure summary combination according to an embodiment of the present invention;

FIG. 14(*a*) to 14(*f*) is a complex bitmap interpretation of test results of a test which used the failure summary combination of FIG. 4 and a bit grouping of 1.

DETAILED DESCRIPTION OF EMBODIMENTS OF THE INVENTION

In the following detailed description, numerous specific details are set forth in order to provide a thorough understanding of the present invention. However, it will be understood by those skilled in the art that the present invention may be practiced without these specific details. In other instances, well known methods, procedures, components and circuits have not been described in detail so as not to obscure aspects of the present invention.

The present invention provides method and a test controller for collecting and transferring off-chip memory failure information in real time while performing a test of memory embedded in a circuit. In general, the method comprises, for each column or row of a memory under test, testing each memory location of the column or row according to a memory test algorithm under control of a first clock, selectively generating a failure summary on-circuit while performing the testing, and transferring the failure summary from the circuit under control of a second clock concurrently with testing of the next column or row in sequence.

A failure summary is comprised of a combination of one or more of a column or row address of a failing cell, one or more failure counts, and failure mask data.

In a preferred embodiment, the step of generating a failure summary includes classifying each detected failure according to predetermined failure types and maintaining a count of the number of failures of each of the predetermined failure types. The predetermined failure types may include a massive failure type which is a predetermined number of failures of adjacent cells in a word of the memory. The predetermined failure types may also include a non-massive failure type which includes single bit failures and multi-bit failures.

The content of a failure summary may differ for a column and a row and a failure summary may also be generated and transferred off-chip at the end of a test phase. Thus, the step of generating a failure summary may include a step of selecting failure data to incorporate into a failure summary based on the memory test phase and/or the memory access mode. This may include selecting a column failure summary having a first set of fields when the memory is accessed in column access mode, selecting a row failure summary having a second set of fields when the memory is accessed in row access mode, and a phase failure summary having a third set of fields upon completion of a test phase. In some embodiments, a failure summary is only generated during column access mode, and no failure summaries are generated during row access mode.

In the preferred embodiment of the present invention, failure summaries are serially transferred off-chip in order to minimize the number of pins required. However, the present invention contemplates transferring failure summary data fields in parallel.

Figure 3:
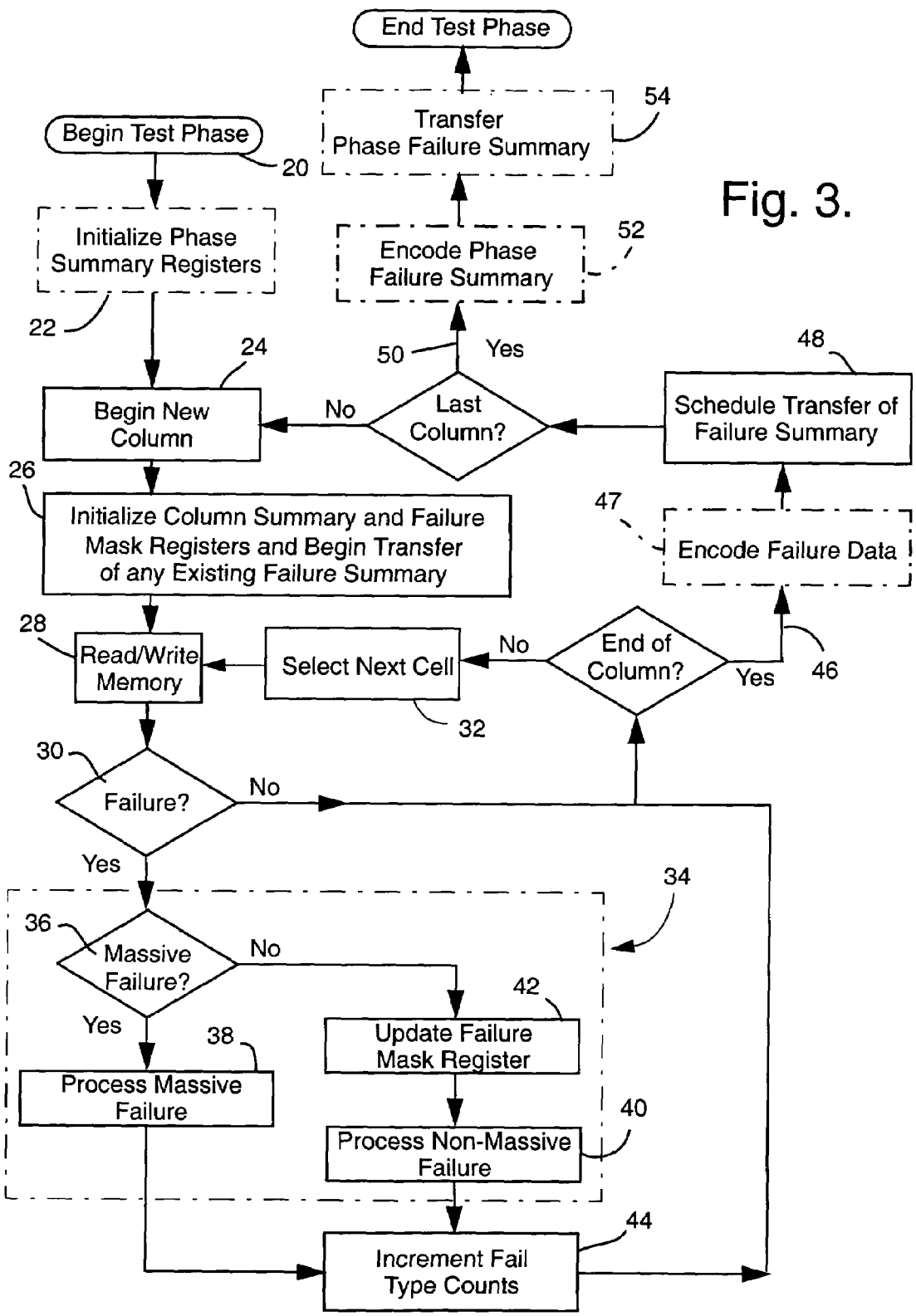
FIG. 3 is a flow diagram illustrating a method of generating a failure summary, according to one embodiment of the present invention.

The method will be better understood with reference to the drawings. FIG. 3 illustrates a flow chart of the method of generating failure summary data according to an embodiment of the present invention. The method shown in FIG. 3 is for test phases that use a column access mode. However, it is to be understood that the same algorithm is used for test phases that use a row access mode.

At the beginning of each test phase (step 20), optional phase summary registers (not shown) are initialized (step 22) and at the beginning testing of each column (step 24), column failure summary registers and a fail mask register contained in a comparators block, described later, are initialized or reset (step 26). A reset will typically occur at the beginning of each test phase, but could also occur several times during a test phase if failure summaries are generated for portions of a column (or row). In addition, if a column failure summary has already been generated for a previous column, the transfer of that failure summary will begin at substantially the same time that the testing of the new column begins. The fail mask register comprises a memory element corresponding to each comparator and the content of a memory element indicates whether a failure occurred at that comparator since the register was last reset.

Next, read and write operations are performed (step 28) according to a memory test algorithm under control of a first clock. The details of the test algorithm are not important. During read operations, the memory data output is compared (step 30) against an expected value. If the data is the same, the next memory location in the column is accessed (step 32) and the read, write and compare operations are repeated. If the data is different, a failure has been detected and is processed.

When a failure is detected, it is classified (step 34) according to predetermined failure types. In a preferred embodiment of the method, a determination is made as to whether the failure is a massive failure (step 36), such as, whether a predetermined number of adjacent data output bits of a word have failed. There is a number of ways to define a massive failure. This is discussed in more detail later. Massive failures are processed (step 38) differently from non-massive failures (step 40). The primary difference is that the failure mask register is updated for non-massive failures (step 42) but not updated for massive failures because a massive failure is most probably results from a defect in the memory access mechanism to the entire location and not from a defect of individual bits. The fail mask register information is updated only when a single or a few bits of a word are failing.

After processing of a failure, massive or non-massive, failure count(s) are incremented (step 44). Failure counts may include one or more of the total number of failed locations, the total number of failed locations with massive failures, and the total number of failed locations with non-massive failures. Within the last category, there may also be a separate counts for single-bit and multi-bit failures. Multi-bit failures are two or more failures in a word of the memory. FIG. 10-13, described later, illustrate an example of a failure classification circuit which discriminates between single-bit failures and multi-bit failures.

After incrementing failure count(s), the next memory location is accessed (step 32) unless all locations in the column have been accessed (step 46). When the test of a column has been completed, column failure summary is generated, possibly encoded (step 47), loaded into a transfer register, and scheduled to be transferred off-chip (step 48) under control of a second clock. In the preferred embodiment of the invention, the failure summary is transferred serially. However, the summary may also be transferred in parallel.

After completing a test phase, when the last column (or row) has been tested (step 50), a phase failure summary may be generated and possibly encoded (step 52) and transferred off-chip (step 54).

The processing of the failures might be sufficiently complex to require more than one clock cycle and, accordingly, it may be performed in parallel with access of the next location so that there is no interruption of the test.

Failure Summary Contents

The method of the present invention seeks to provide the maximum amount of failure information that can be transferred to a tester without having to interrupt a test performed at-speed, i.e., while testing the cells of a column or row. In several cases, a complete bitmap indicating the exact location of all failures can be obtained in a single pass. In cases where the density of failures is such that the exact location of each failure cannot be transferred to the tester, statistics about the failures and partial information about the location can be transferred instead. This information might still be sufficient in some applications such as process monitoring and yield analysis. However, if more information is required, the memory test can be repeated and focus on portions of the memory.

A failure summary is generated for each column during test phases that use the column access mode (fast row) and for each row during test phases that use the row access mode. The failure summary format or content might be different during column access mode phases and row access mode phases. This is because there could be significantly smaller number of words in a row than in a column in embedded memories which use very long words, thus leaving less time to transfer failure information. Another type of failure summary format could be provided at the end of test phases to report additional information, such as the row address of bad rows, the location of isolated failures, the exact count of various failures instead of ranges, and so forth. It is also possible to defer unloading this information until the end of the test at the cost of additional on-chip storage.

Figure 5:
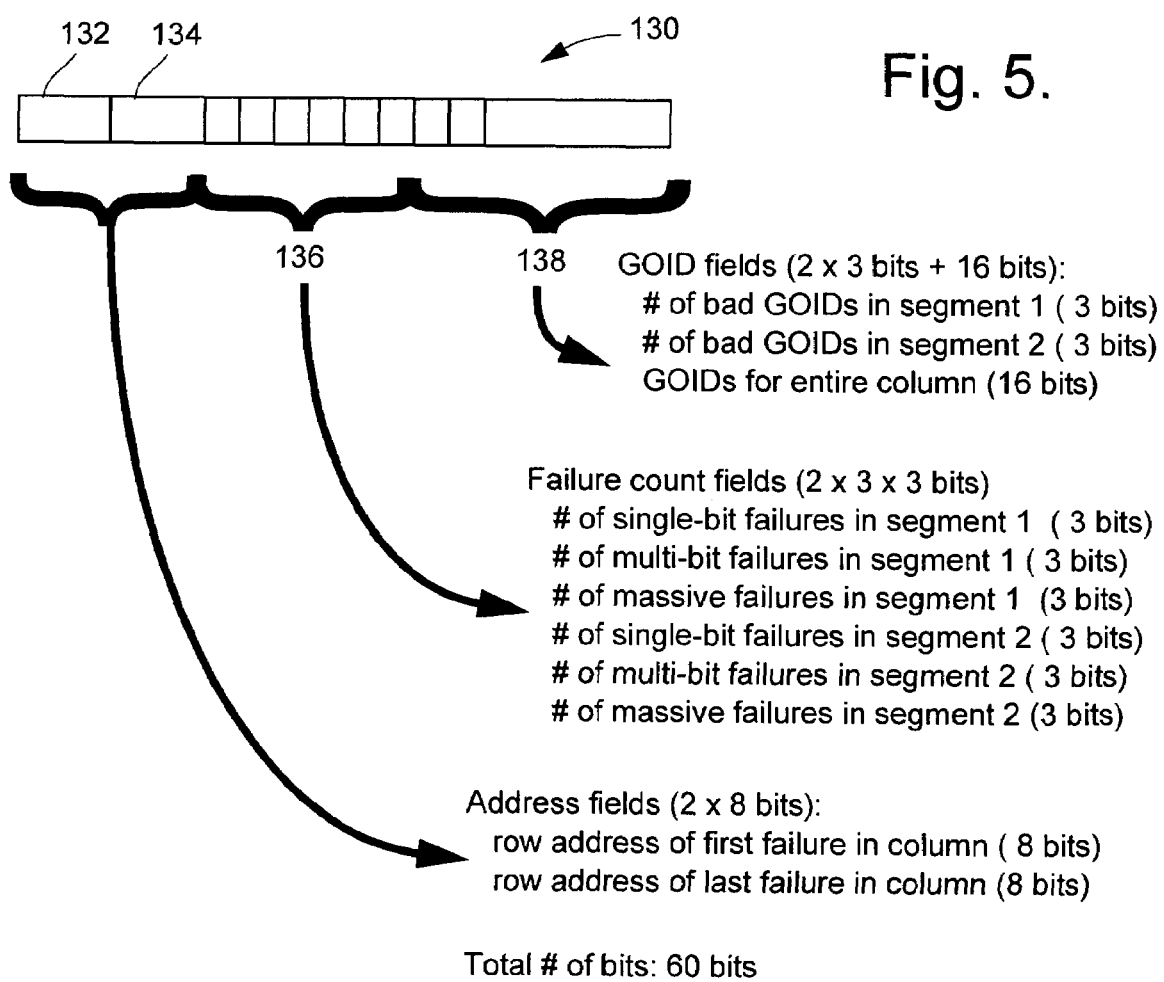
FIG. 5 illustrates a second example of a failure summary combination without row access mode, according to an embodiment of the present invention.

FIGS. 4, 5 and 6, described more fully later, illustrate examples of failure summaries. Each of these summaries is comprised of one or more of the address fields, failure count fields, and failure mask register. Different failure summary formats are required to accommodate the time available to transfer the summaries during the column access mode and the row access mode. The amount of time available for transmitting failure summaries in real time will vary from one memory to another and from one access mode to the other.

Address Fields

Address fields store the row (or column) address of failures. Since only a limited number of such addresses can be reported, a useful option is to report the first and/or last failure address in a column. This option is useful in identifying two isolated failures and the beginning and end of a group of failures in a column (partial/full column defects). Combined with the information in failure count fields, a density of failures can be determined. One bit can be appended to each address field to indicate that an error occurred at the next address so as to thereby identify two-cell failures. Only the row (or column) address is necessary since the other components (e.g. test phase and column (or row)) of an address are implicitly known from the time of transfer of the failure summary.

Failure Count Fields

Failure count fields may include counts for single-bit failures, multi-bit failures (i.e. two or more bit failures which are not massive failures) and massive failures (e.g. at least one block of four consecutive defective bits in a word fail, other definitions possible).

Failure counts are useful in interpreting the test mask register (GOIDs). For example, a high count of single-bit failures and more than one GOID set means that one of the GOIDs corresponds to a column failure and the others to isolated failures. On the other hand, a high count of multi-bit failures means that two or more columns are bad.

Reporting of the exact value of the count during a column access only can be deferred until the end of the column test. During a column access, exact values up to three could be reported and thereafter ranges, such as >25%, >50%, and so on, could be reported. This requires encoding on three bits. The encoding could be done for memory segments (maximum of 2 or 4) of the column because partial column failure may be of interest. It will be appreciated by those skilled in the art that other forms of encoding are possible.

The counts are likely to represent counts of failed locations as opposed to mis-compares. It is not uncommon to encounter test phases where more than one compare occurs per location.

In order to distinguish single-bit failures from multi-bit failures, the present invention provides a circuit such as that shown in FIG. 10 to 13, described later. Pipelining is needed for a large number of failure mask register bits (GOIDs). An alternative to pipelining is to always restrict the number of data output bits processed to eight (or whatever number seems reasonable). These groups of eight bits can be tested serially or in parallel. The parallel embodiment requires generating failure summaries and providing a serial output for each group.

The massive failure type can be identified in a number of ways. The goal is to distinguish between failures which result from failures of row or column access mechanisms and failures which result from individual bits. The criterion needs to take into account partial row or partial column failures. Massive failures tend to affect consecutive bits of a word. For example, a group of four adjacent failing bits in the failure mask register could be defined as a massive failure.

Failure Mask Register (GOID fields)

The failure mask register has a memory element associated with one or more comparators with each comparator being associated with one or more memory outputs. The most accurate results are obtained when there is one memory element associated with one comparator and one memory output. A memory element of the register contains an active value (logic 1) when a failure occurred on the associated data output(s) since the last time the register was initialized. Typically, this register is initialized at the beginning of a new column, in column access mode, or the beginning of new row, in row access mode, but initialization could be more often if statistics on segments (or portions) of a column (or row) are needed.

For memories with relatively short words (e.g., less than 8 or 16 bits), it is possible to transfer the entire fail mask register concurrently with the testing of a column or row. It might even be possible to transfer the failure mask more than once for the same column.

However, for memories with longer words and operating at a relatively high speed with respect to the tester, some trade-offs might be necessary. As already mentioned, one possibility is to divide the memory outputs into several groups and generate several failure summaries in parallel.

Another possibility is to employ encoding schemes in order to avoid having to transfer an entire failure mask. This approach is based on the assumption that there are relatively few failing memory data outputs in the same column or row.

For example, consider a memory having 64 outputs, i.e. 64 bits in a word. Instead of transferring 64 bits of failure mask, one encoding scheme is to transfer a 5-bit index or number that indicates the bit position of the output that failed together with one bit to indicate whether there are more than one failing bit in the failure mask. This form of encoding is useful when a memory tends to have single-bit failures.

Alternatively, if there are 64 GOIDs in the failure mask and it is assumed that all failures are in the same group of 8 bits, a report can be made in less that two bytes. A failure summary could have three bits to identify the group that has failures, eight bits to contain the actual GOIDs of that group and one bit to indicate whether more than one group failed, for a total of 12 bits instead of 64 bits.

If more than one group has failures, there are a few choices. Only the GOIDs of one of the groups could be reported (always follow the same convention or change the convention based on the test phase to pick up all failures as the algorithm evolves). Other encoding schemes are possible.

Statistics could be computed per segment on GOIDs. For example, the number of bad GOIDs in a segment could be counted. This has the advantage of resolving some ambiguities. For example, suppose there are errors in the first column segment that affect two GOIDs and errors in the second segment that affect two GOIDs as well, but one error is common with the first segment. At the end of the column, three GOIDs will show errors. The regions of ambiguity would be reduced considerably by knowing the number of failing GOIDs on a per segment basis. The count of GOIDs is relatively inexpensive. The number of bad GOIDs can be counted serially as the next segment is being processed and/or shifting other fields of the summary. This would involve copying the GOIDs into a shadow register. It can also be arranged to have less GOIDs than bits in the other field. If there are more GOIDs than bits for the other fields, counting would have to be done by 2 or 4 bits to have the result ready in time.

FIG. 4 illustrates a first example of a failure summary combination which may be used in a circuit. A failure summary combination is the column summary format, row summary format and phase summary format designed or provided for a particular memory. FIG. 4(a) illustrates a column failure summary 100 which has two row address fields 102, 104 and two failure count fields 106, 108. Additional bits 110, 112 are associated with address fields 102, 104, respectively, to indicate whether an adjacent bit failed. The address fields store the low and high row addresses of failing rows, excluding addresses of massive failure bits. The failure count fields store the number of non-massive failures and the number of massive failures. The failure counts are encoded using three bits as described earlier.

FIG. 4(b) illustrates a row failure summary 114 which is comprised of two failure count fields 116, 118, which store the number of non-massive failures and the number of massive failures. The size of the row failure summary may be smaller than that of a column failure summary because a row usually has a smaller number of columns than a column has rows.

FIG. 4(c) illustrates a phase failure summary 120 containing a field 122 for failure mask register data.

FIG. 5 illustrates another possible failure summary combination which includes a column failure summary 130 for each of two memory address segments and no row failure summary. The column failure summary includes row address fields 132, 134 for the first and last failures, respectively, detected in a column, failure count fields 136 for the number of single bit failures, the number of multi-count failures and the number of massive failures, and a failure mask register contents field 138 for the entire column and includes fields for the number of bad GOIDs in memory segment 1, the number of bad GOIDs in memory segment 2 and the GOIDs for the entire column. For very wide memories, the failure mask register contents may be encoded. In this embodiment, the failure summary combination does not include a row failure summary or a phase failure summary.

Figure 6A:
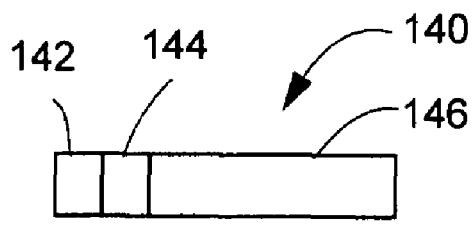
FIGS. 6(a) and 6(b) illustrate a third example of a failure summary according to an embodiment of the present invention.
Figure 6B:
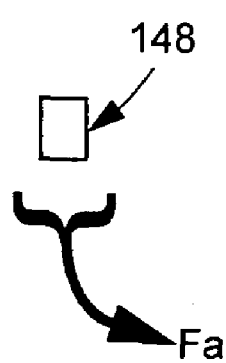

FIG. 6 illustrates a third possible failure summary combination which includes a column failure summary 140, shown in FIG. 6(a), having two failure count fields 142, 144 for massive and non-massive failures, respectively, and a failure mask register data field 146 (encoded or not). FIG. 6(b) illustrates a row summary 148 which simply contains a single field for storing the number of failures in a row under test. This failure summary combination does not include a phase failure summary.

Test Controller

The present invention provides a memory test controller which includes means for testing each memory location of a column or row of the memory according to a test algorithm under control of a first clock, means for generating a failure summary while testing a column or row of the memory; and means for transferring the failure summary from the circuit via a circuit output under control of a second clock while testing the next column or row, if any, of a memory under test.

Figure 7:
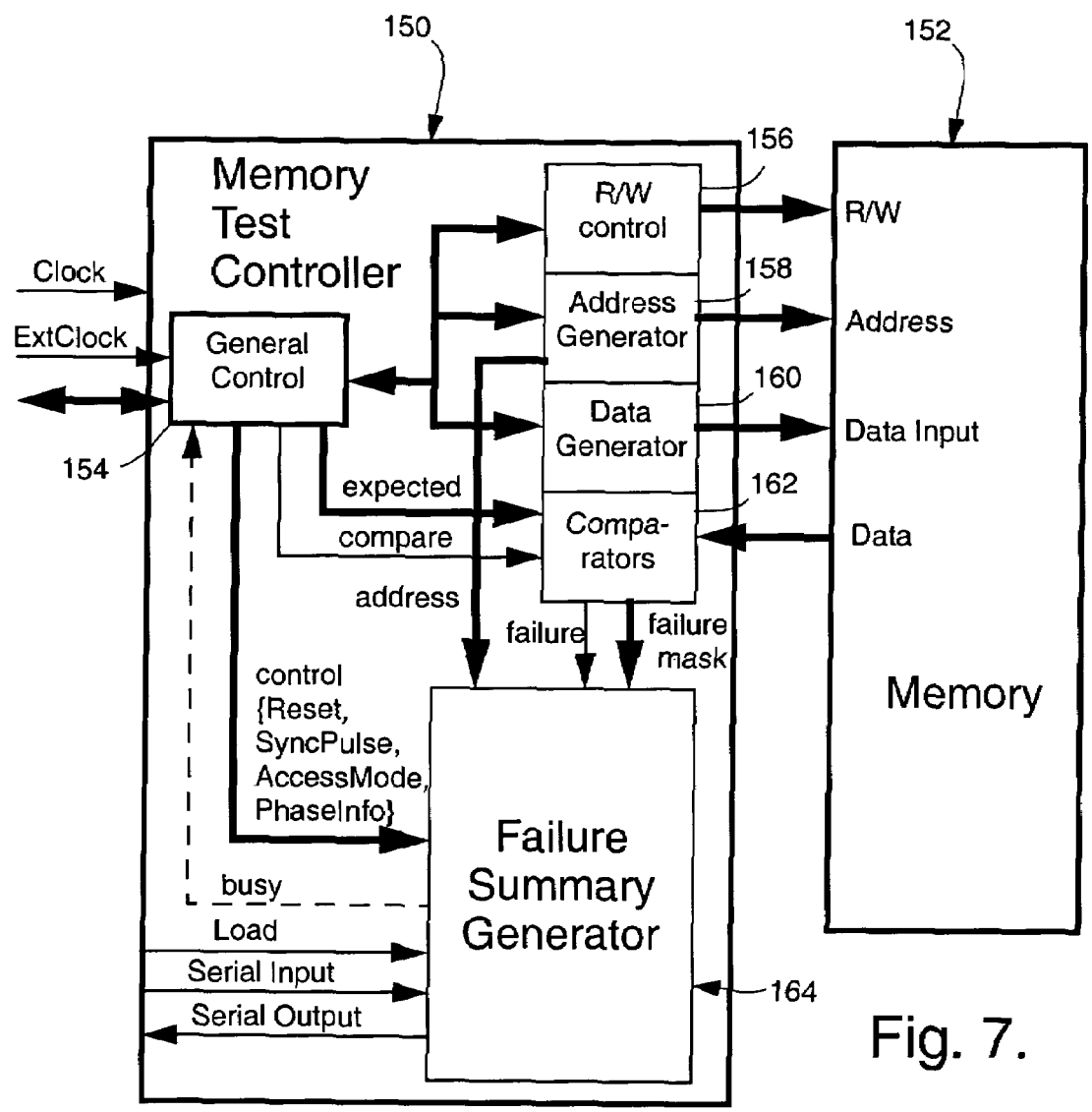
FIG. 7 is a block diagram representation of a memory test controller architecture according to an embodiment of the present invention.

FIG. 7 diagrammatically illustrates an embedded memory test controller 150 connected to a memory 152. It will be noted at the outset that the heavy or bolded lines in the various figures represent buses. The memory test controller is typically embedded in an integrated circuit (not shown). The memory can be embedded in the same integrated circuit that contains the test controller or it could reside off-chip. For simplicity, the figure does not show functional connections to the memory. The memory test controller can be shared among several memories.

Memory test controller 150 is comprised of several blocks. All blocks are controlled by a first clock (Clock). A general control block 154 interacts with all other blocks as well as with an external tester (not shown) either directly or through a circuit test access port (not shown). In general, interaction with a tester is limited to initiating a memory test and, optionally, collecting failure information. Both operations require the setting of registers (one or more groups of memory elements) of the test controller to appropriate values and reading registers containing relevant information after the execution of a memory test.

General control block 154 determines the sequence of memory read and write operations that are to be performed to test the memory. The interaction of the general control block with the R/W control 156, address generator 158 and data generator 160, as well as the connections between the memory and the test controller, are well known in the art and, accordingly, are not described herein. The description herein is limited to comparators block 162 and the failure summary generator block 164, and their interaction with the other blocks.

The sequence of read and write operations is determined by memory test algorithms which are well known in the art. These algorithms are divided into phases. Several algorithms are designed so that, during a phase, all memory locations are accessed in a column access mode or a row access mode. In column access mode, the same sequence of read and write operations is applied to all memory locations of a column, one location at a time, before another column is accessed. The sequence is repeated until all locations of the column have been accessed. Similarly, in row access mode, the same sequence of read and write operations is applied to all memory locations of a row, one location at a time, before another row is accessed. The sequence is repeated until all locations of the row have been accessed.

As already indicated, it is assumed that the that at least some phases of the memory test algorithm employ a column or row access mode. During these phases, failure summary data is generated for each column (or row) on-chip and transferred off-chip for analysis. Failure summary generator 164 receives various inputs from comparators block 162 at a system clock rate, but transfers failure summary to a tester at a tester clock rate, which is usually significantly lower than the system clock rate.

Figure 8:
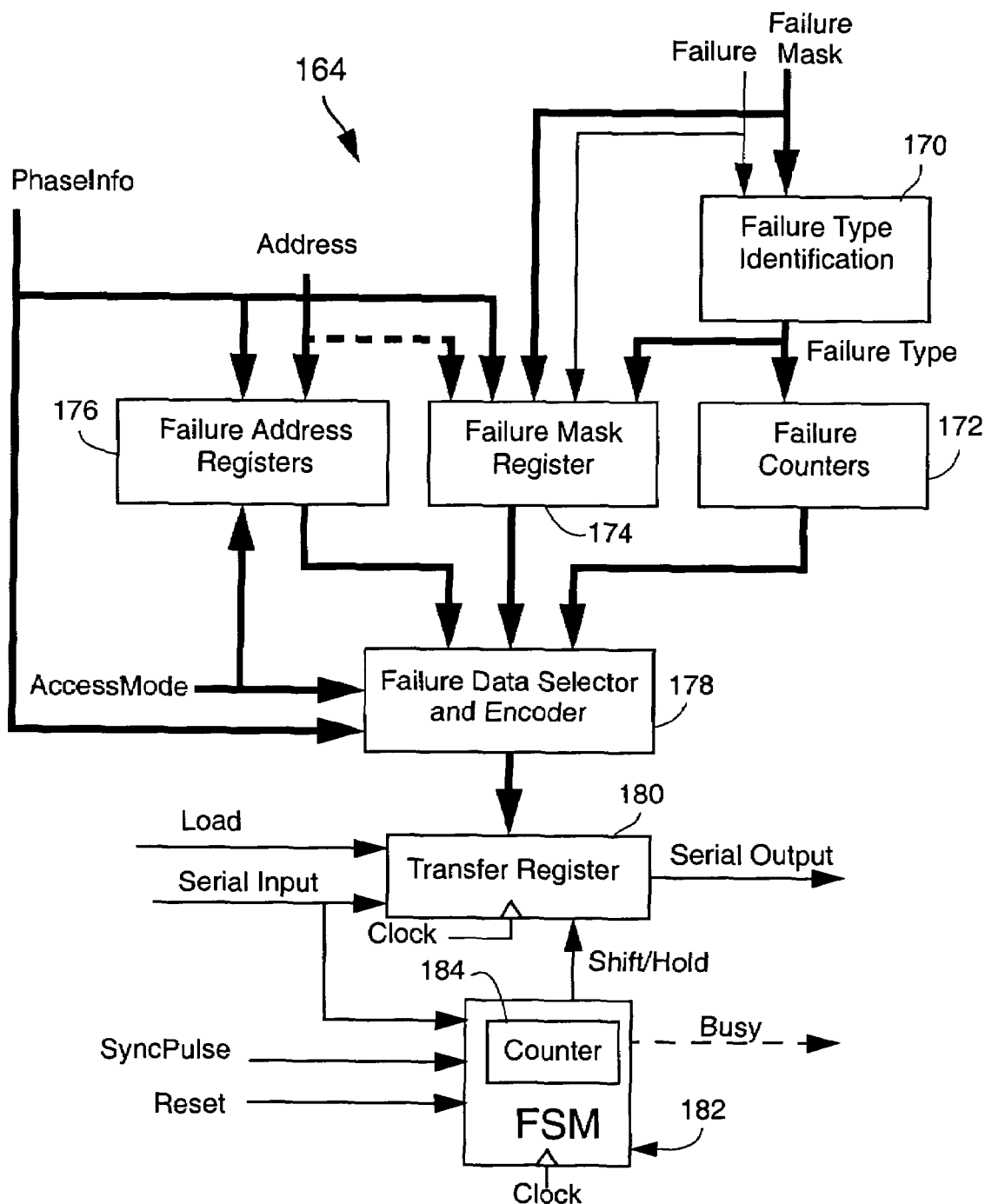
FIG. 8 is a block diagram representation of failure summary generator architecture according to an embodiment of the present invention.

FIG. 8 diagrammatically illustrates failure summary generator 164 according to an embodiment of the present invention. Failure summary generator 164 includes a failure type identification block 170 which receives a failure signal and failure mask data from comparators block 162, and outputs failure type data to failure counters 172 and a failure mask register 174, illustrated in more detail in FIG. 11. The failure signal is active if any bit of the failure mask is active. A failure mask is the result of the comparison of a plurality of memory outputs and corresponding expected data.

A failure address block 176 receives memory address data from address generator 158, and Phase Information (PhaseInfo) and an access mode signal, AccessMode, from general control block 154 and outputs failure address data to a failure data selector 178, which also receives Access Mode and Phase Information from general control block 158, failure mask data from failure mask register 174 and failure count information from failure counters 172. Failure data selector 178 loads summary data to be output from the circuit into a transfer register 180 and may also encode data according to a predetermined encoding scheme. Alternatively, data could be encoded prior to delivery to selector 178. The data loaded into the transfer register depends on the specific failure summary combination which was designed for the circuit, the access mode and phase of a test. The transfer register operates under control of the Clock signal and a small finite state machine (FSM) 182. The transfer register has a serial input and a serial output and a clock input which receives the Clock signal. FSM 42 includes a counter 184 which counts the number of bits which have been loaded/unloaded into/from the transfer register.

It will be understood by those skilled in the art that the method can be adapted for use with more complex phases of an algorithm that access each location multiple times during the same phase. For example, an algorithm called "bit-surround" accesses, for each reference location, the reference location itself as well as all locations surrounding it. Since all locations are used as reference, each location is accessed more than once during a single phase of the algorithm. It might be preferable to only consider the failure information related to the reference cell to simplify the generation of the failure summary during this phase.

Figure 2:
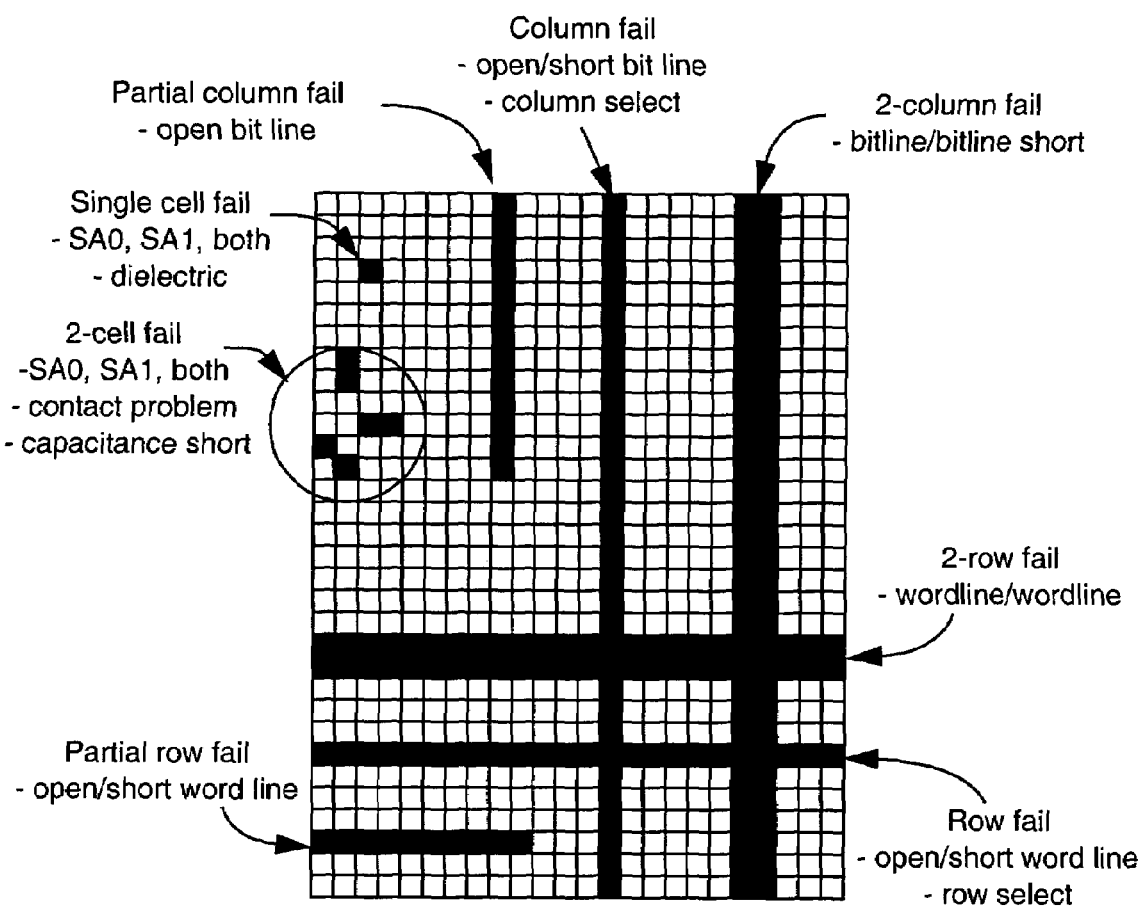
FIG. 2 illustrates Static Random Access Memory (SRAM) and Dynamic Random Access Memory (DRAM) bitmaps of interest and potential failure causes.

On-chip classification of some of the double failures (2-cell, 2-column or 2-rows) shown in FIG. 2 might require a test controller mode that performs address mapping (or scrambling) so that two consecutive accessed cells, columns or rows are physically adjacent in memory. If this mode is not available or enabled, the identification of these failures will require additional circuitry or will need to be performed by a computer off-chip.

For memories with multiple blocks, it is preferable to generate an individual failure summary for individual blocks. However, multiple serial outputs can be used to transfer failure summaries corresponding to different blocks at the expense of extra registers in the failure summary block.

Timing of Failure Summary Transfer

Figure 9:
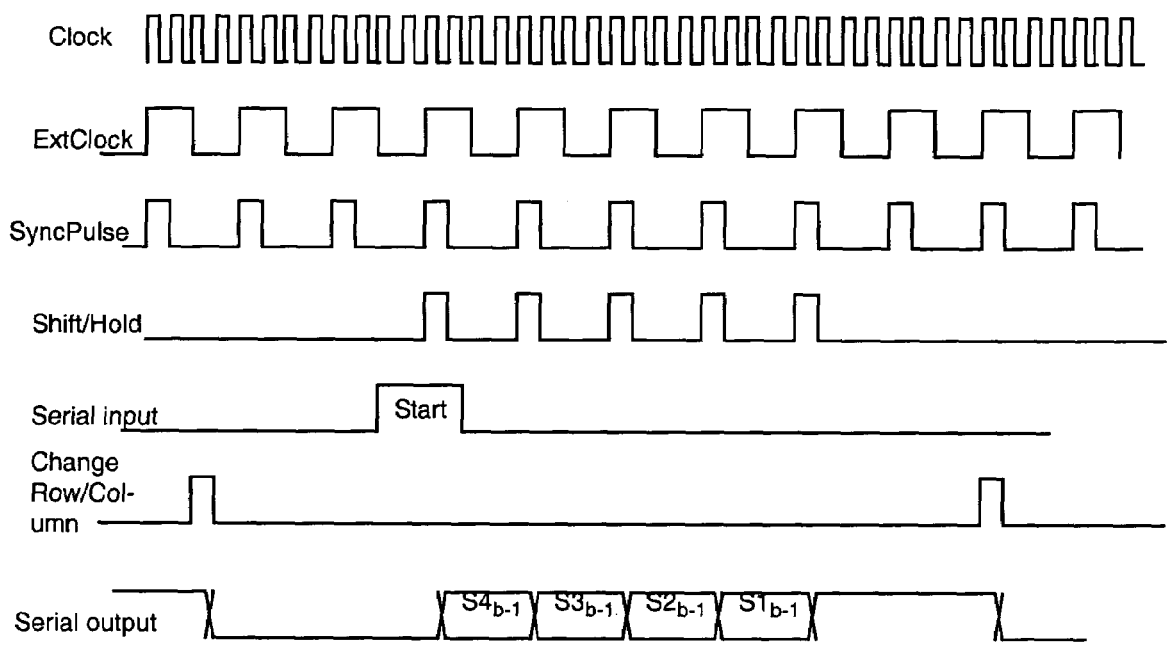
FIG. 9 is a timing diagram illustrating the timing of the transfer of failure summaries.

FIG. 9 is a detailed timing diagram of the transfer of the failure summary to a tester. The first waveform, Clock, shows a first clock used to perform the memory test. Ideally, the clock period of this first clock is substantially the same as the clock period used during the normal mode of operation of the memory. The second waveform, ExtClock, is a second clock used to synchronize the transfer of the failure summary to the tester. The period of the second clock is longer than that of the first clock. An asynchronous interface similar to that described in Applicants' U.S. Pat. No. 5,900,753, incorporated herein by reference, using the first and second clocks as input, generates the synchronization pulses, SyncPulse. These pulses indicate when to sample the serial input using the first clock. The serial input is sampled until a start bit is detected. The start bit is set by the tester at the end of each column and/or row.

Once the start bit is detected, the failure summary data is copied to the transfer register and shifted out under control of pulses of a Shift/Hold signal generated by FSM 182 (FIG. 8) in failure summary block 164 of the test controller. The Shift/Hold signal is a gated version of the SyncPulse signal. One bit of the failure summary is output on each pulse of Shift/Hold until all bits of the summary have been shifted out.

In the simple example of FIG. 9, the failure summary has only four bits, as indicated by the Serial Output waveform, but the summary could have more or less bits. The maximum number of bits of a failure summary is determined by the longest time required to test a column or row divided by the period of the second clock, ExtClock, used to perform the transfer. Note that the failure summary which is transmitted corresponds to the previous column (or row) tested. The transfer is performed concurrently with the test of a new column or row using methodology similar to that disclosed and claims in Applicants' corresponding U.S. patent application Ser. No. 10/180,116 filed on Jun. 27, 2002 for "Scan Test Method Providing Real Time Identification of Failing Test Patterns and Test Controller for Use Therewith", incorporated herein by reference. The serial input to the transfer register can be used to shift in parameter values to be used during the test of the next column or row.

A minimum of one serial input and one serial output is needed for each transfer register. If several controllers are used in parallel, output pins dedicated to each controller are needed. More than one output could be used for each controller to facilitate obtaining failure information respecting several memories in parallel or of multiple segments of the same memory. For example, if a memory has 32-bit words and is built as two blocks, one block containing the first 16 bits of every word and the other block containing the last 16 bits of every word, failure summaries can be generated and transmitted on two outputs, one for each block. Using multiple outputs for the same memory will maximize the probability of being able to generate a complete bitmap in a single pass at the expense of more silicon area. On the input side, the number of pins depends on whether the controllers are operated asynchronously. Asynchronous operation involves a dedicated serial input for each controller. Synchronous operation involves a pause at the end of a column (or row).

Other general statistical information could also be generated and stored in appropriate registers (not shown) and scanned out at the end of each test phase and/or at the end of the test. General statistics could include, for example, the total number of mis-compares and/or locations with mis-compares. Other statistics are possible. These general statistics could be output using the output pin associated with transfer register 180 described above or using test controller normal setup mode functions.

Figure 10:
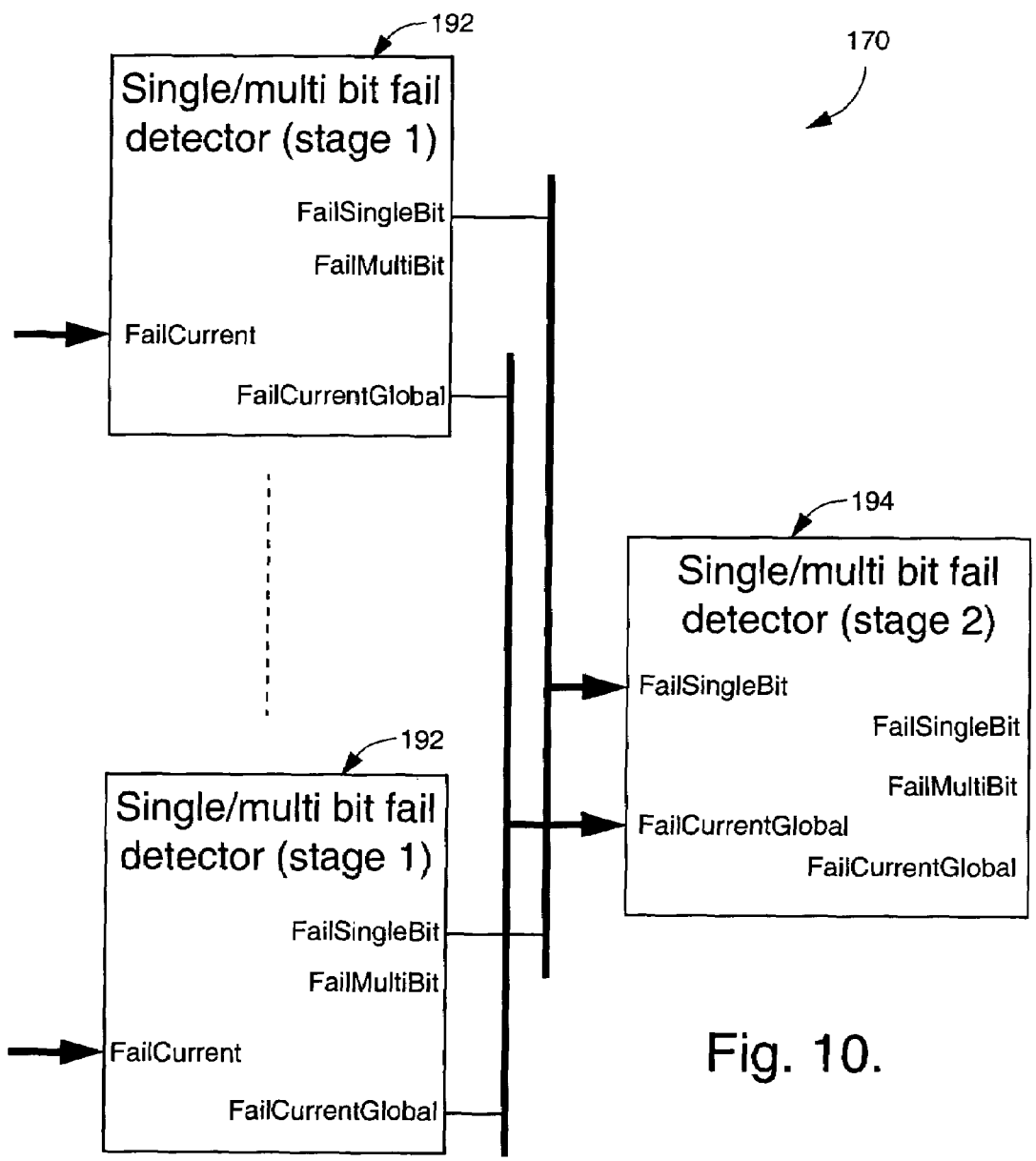
FIG. 10 is block diagram illustrating cascading of first and second stages of single bit and multi-bit detectors of FIG. 12 and FIG. 13.

FIG. 10-13 illustrate an embodiment of a failure type identification block 170 which classifies detected non-massive failures as either single bit failures indicated by a signal labeled FailSingleBit, and multi-bit failures indicated by signal FailMultiBit. However, it is to be understood at the outset that the failure type identification block may be designed to detect any of the failure types illustrated in FIG. 2, including massive failures. FIG. 10 is a block diagram of block 170 which shows that the failure type identification block includes one or more stage 1 detector blocks 192, shown in detail in FIG. 12, whose outputs are applied to a stage 2 detector block 194, shown in detail in FIG. 13.

Figure 11:
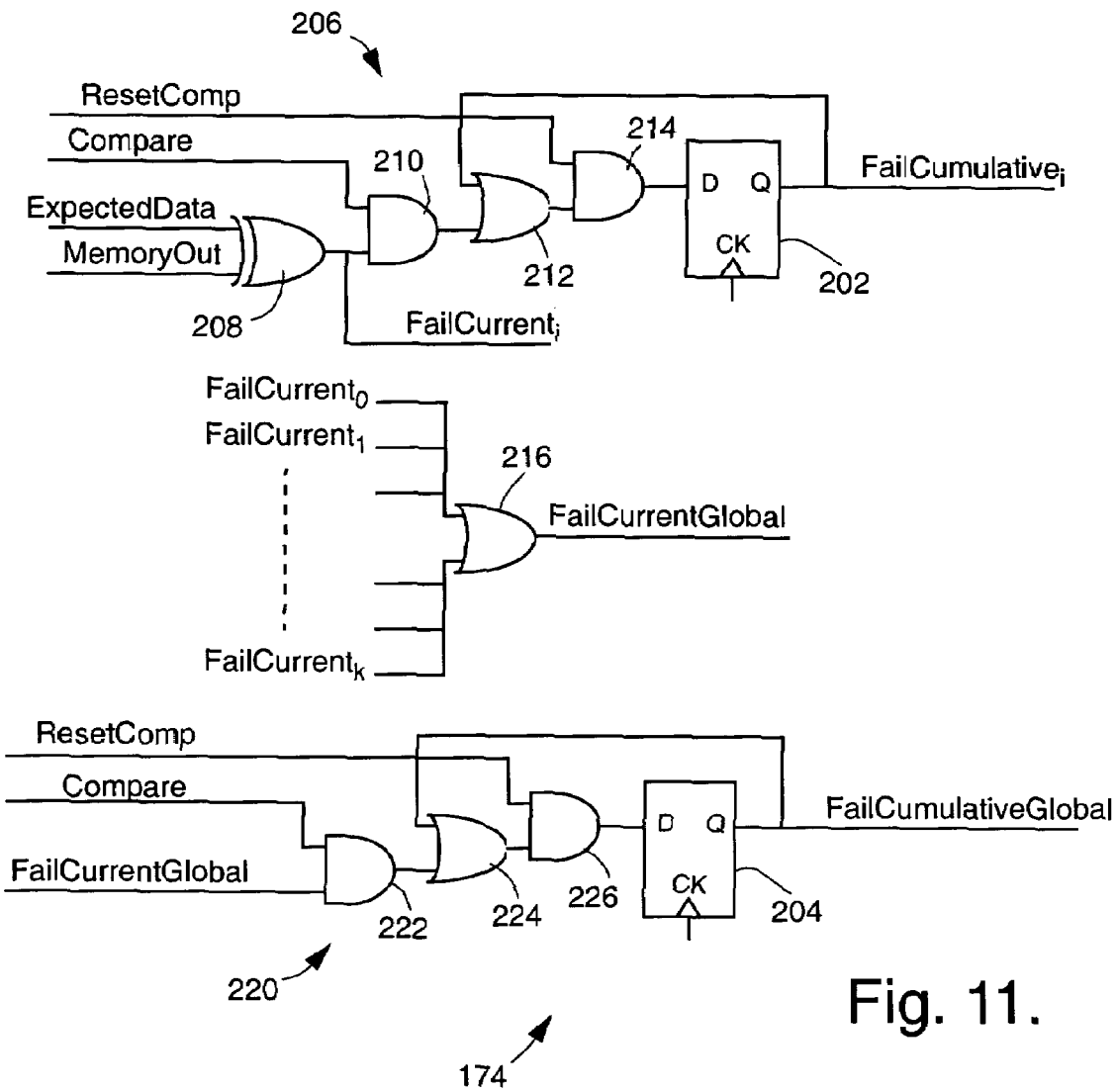
FIG. 11 illustrates a fail mask and fail mask register according to an embodiment of the present invention.

FIG. 11 illustrates a portion of a fail mask register 174. The fail mask register includes two memory elements 202 and 204 in the form of flip-flops. One memory element 202 is provided for each memory output, as indicated by index i. There is only one memory element 204 irrespective of the number of memory outputs. The collection of $FailCurrent_i$ signals form the failure mask of FIG. 8. The flip-flops in the failure mask register and in the comparators block can be the same to reduce the overhead. The FailCurrentGlobal signal is the same as the Failure signal in FIG. 8.

As indicated, a memory element 202 and associated logic circuitry 206 is provided for each memory output, labeled MemoryOut. Logic circuitry 206 includes an EXOR gate 208 which receives a MemoryOut signal and expected data signal, labeled ExpectedData. The output of gate 208, labeled $FailCurrent_i$, is active (logic 1) if its two inputs are different. The output is applied to one input of AND gate 210 whose other input receives a compare signal from general block 154 of the test controller. The output of AND gate 210 is applied to one input of an OR gate 212 which also receives the output of memory element 202, labeled $FailCumulative_i$. The output of the OR gate 212 is applied to an AND gate 214 which also receives a reset signal, which operates to initialize the contents of memory element 202. The $FailCumulative_i$ signal indicates whether one or more errors were detected at memory output i.

The FailCurrent signal associated with all or a sub-group of k memory outputs are applied to an OR gate 216, whose output is a signal labeled FailCurrentGlobal, which indicates whether an error was detected at one or more memory outputs or in a sub-group of memory outputs.

A logic circuit 220 is associated with memory element 204. The FailCurrentGlobal signal, output by OR gate 216, is applied to one input of an AND gate 222 whose other input is a compare signal. The output of AND gate 222 is applied to an input of OR gate 224 whose other input is the feedback output of memory element 204. The output of the OR gate is applied to one input of AND gate 226 which also receives the reset signal, labeled ResetCom. The output of AND gate 226 is applied to the input of memory element 204, whose output is a signal called FailCumulativeGlobal and indicates whether one or more failures have been detected in a group of outputs of the memory.

Figure 12:
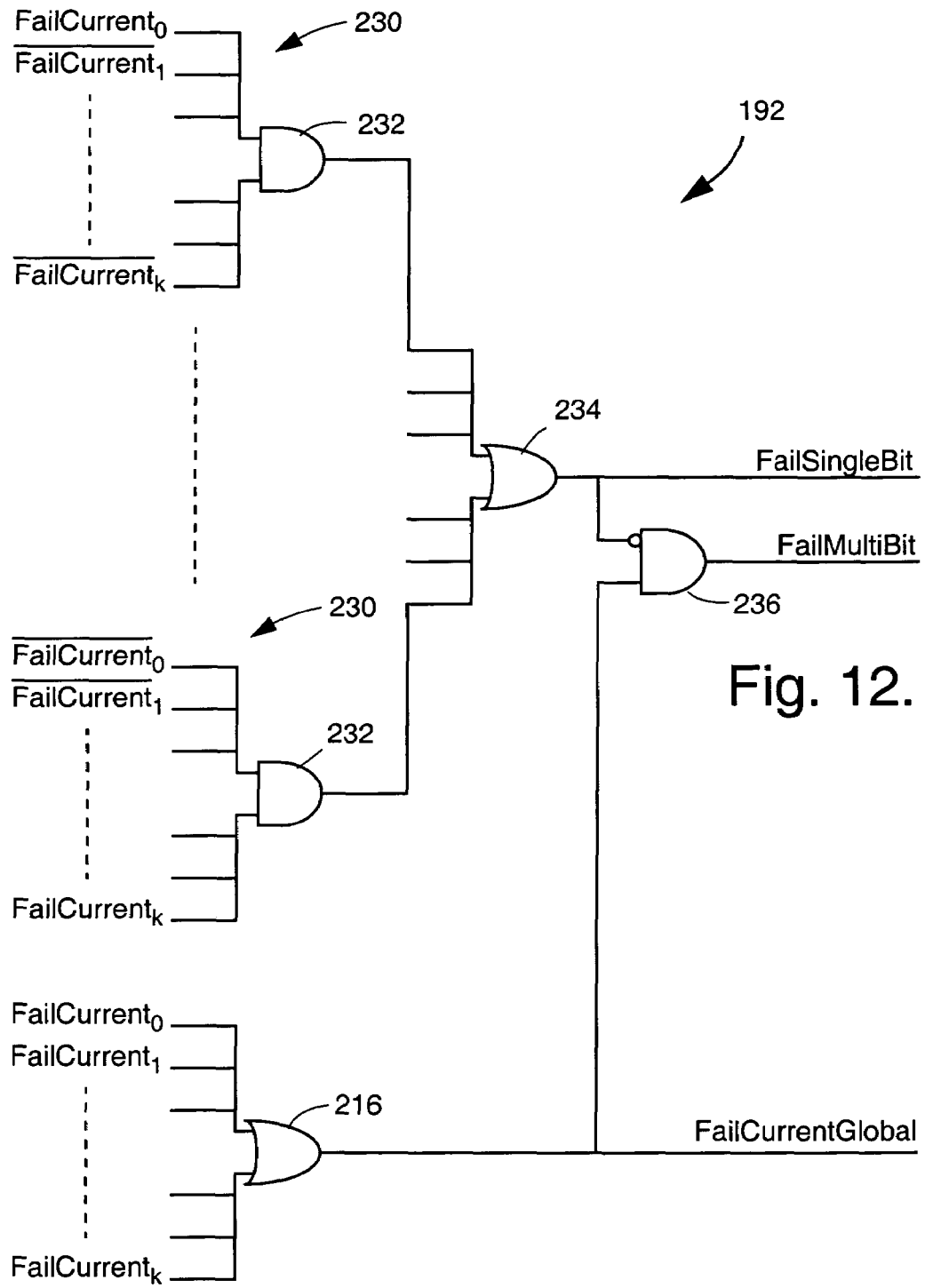
FIG. 12 illustrates a first stage of a circuit for detecting single-bit and multi-bit failures according to an embodiment of the present invention.

Referring to FIG. 12, each stage 1 detector circuit 192 includes one or more circuits 230, which serve to determine whether a particular memory output is the one and only failing output of a group of k outputs. These circuits include an AND gate 232. The FailCurrent signal associated with the particular memory output together with inverted values of the FailCurrent signal of a number of other memory outputs of the group of k outputs are applied to one input of AND gate 232.

The outputs of each of AND gate 232 of circuit 230 are combined and applied to one of the inputs of OR gate 234. The output of OR gate 234 is a FailSingleBit signal. The inverted value of this signal is applied to one input of AND gate 236 whose other input receives the FailCurrentGlobal signal corresponding to an associated number, k, of memory outputs. The output of AND gate 236 is a FailMultiBit signal. This signal is active only of FailSingleBit is inactive and FailCurrentGlobal is active.

Figure 13:
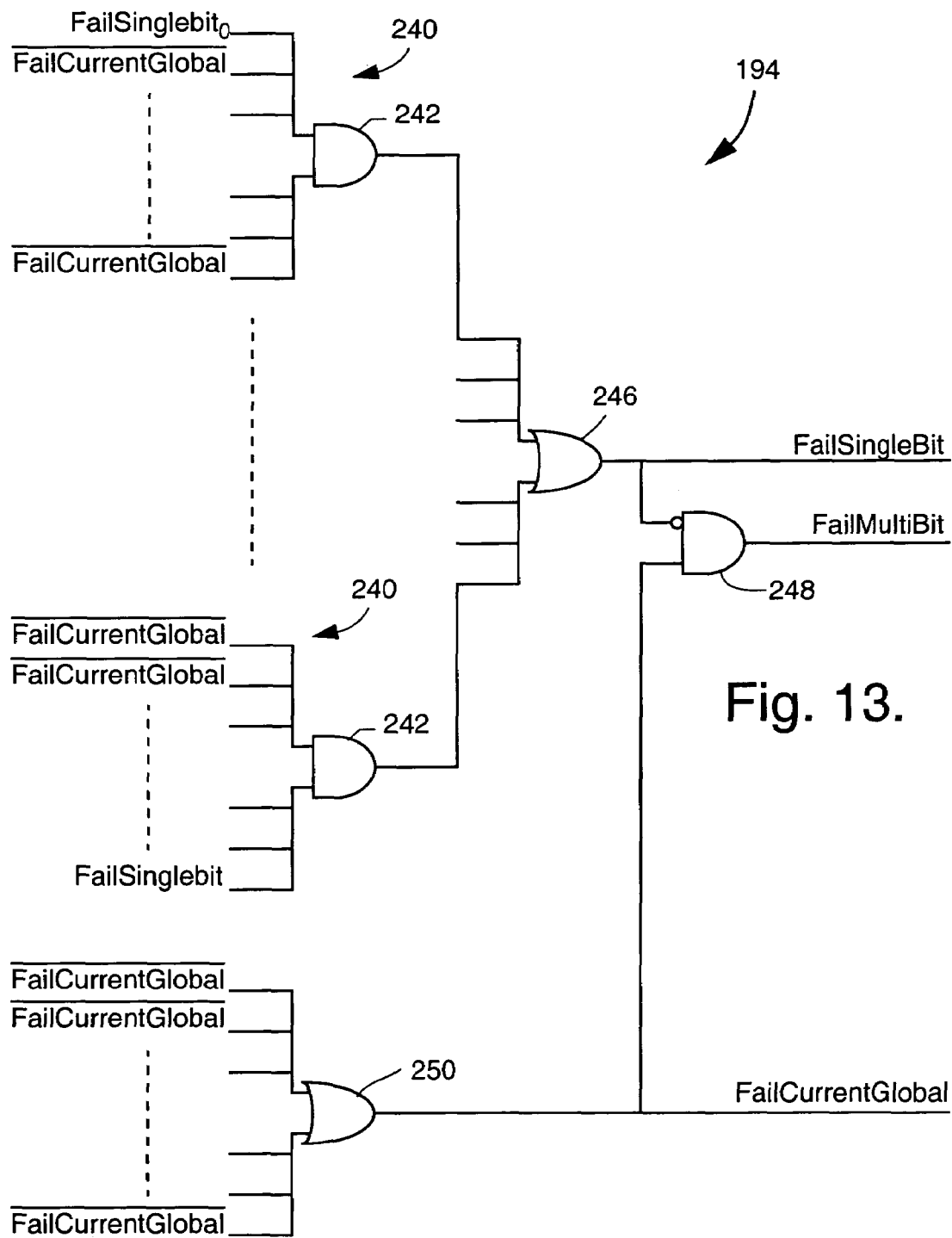
FIG. 13 illustrates a second stage of a circuit for detecting single-bit and multi-bit failures according to an embodiment of the present invention.

Referring to FIG. 13, stage 2 circuit 194 includes a number of circuits 240, similar to circuits 230, which serve to determine whether a particular FailSingleBit signal is the one and only output with a failure. Each FailSingleBit signal is combined with inverted values of the FailCurrentGlobal signal in an AND gate 242 whose output is applied to an input of OR gate 246. The output of OR gate 246 is a second level FailSingleBit signal which is inverted at the input of AND gate 248.

Inverted values of all FailCurrentGlobal signals are applied to inputs of OR gate 250 which outputs a second level of the FailCurrentGlobal signal. This signal is applied to one input of AND gate 248 which receives the inverted second sage FailSingleBit signal to produce a second stage FailMultiBit signal. The outputs of the second stage detector circuit 184 are applied to respective counters in counters block 172.

It will be understood that the circuitry shown in FIG. 10-13 is merely one example of an error type classification circuit and that other circuitry can be designed to target other types of errors without departing from the present invention.

EXAMPLE

Figure 1:
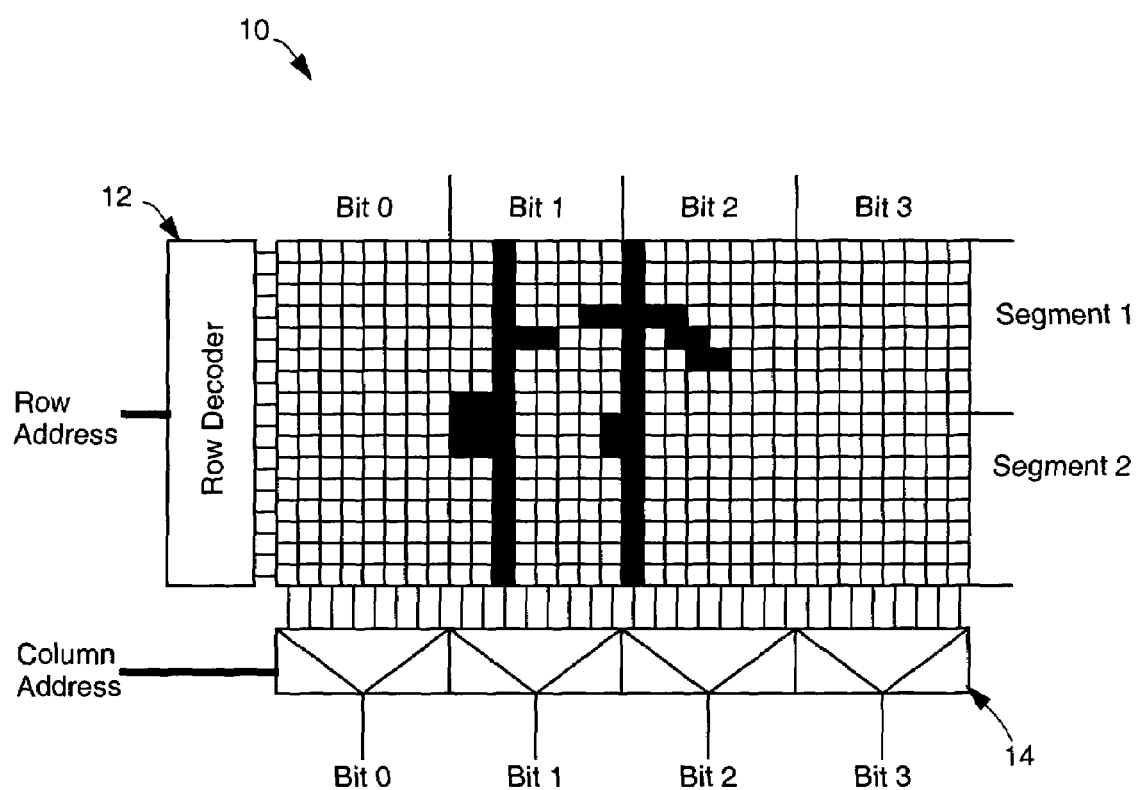
FIG. 1 diagrammatically illustrates a memory architecture with a failure pattern example.

FIG. 14 illustrates an example of bitmaps and failure summaries generated for the memory shown in FIG. 1. For purposes of illustration, it is assumed that all words of the memory have 16 bits (bits 0 to 15). Only the first 16 rows of the memory are shown. The actual number of rows is typically 256 or more. It is assumed that there are no failures in rows below row 16. The number of rows and columns is not important.

The figure illustrates the results of a test which included making three passes of a test algorithm that has two phases in which the first phase uses a column access mode and the second phase uses a row access mode. It will be noted that a second or more passes are performed only if there are ambiguities due to more than one bit having failures and that one or more of the bits have a large number of failures at the same column address. The failure summary combination of FIG. 4 was used to collect failure summary data. FIG. 14(e) shows the actual column failure data. Row failure summary data are the numbers to the right of FIG. 14(b) to FIG. 14(d). FIG. 14(f) shows failure mask register data transferred off-chip at the end of each of the three passes. Counts of the numbers of failures in a column or row were performed. The numbers of failures were encoded according to the legend below FIG. 14(d).

For simplicity, FIG. 14(a) to FIG. 14(d) illustrate Bit 1 and Bit 2 only. FIG. 14(a) is a bitmap showing bit 1 and bit 2 of the memory of FIG. 1 with the same defects. FIG. 14(b) illustrates a bitmap showing decoded failure summary data resulting from pass 1 of the test algorithm.

As mentioned, the first phase uses a column access mode and results in the failure summaries shown in FIG. 14(e). One column summary is produced for each column address given in the left-hand column of FIG. 14(e). More specifically, FIG. 14(e) shows three groups of column summaries corresponding to pass 1, bit 1 of pass 2, and bit 2 of pass 2.

The second phase of the algorithm used a row access mode. During this phase, the row summaries simply consist of two parts: the number of non-massive failures and the number of massive failures, as shown in FIG. 4(b). The number of non-massive failures is shown directly in FIG. 14(b)-(d) adjacent the right hand side of each row. The number of massive failures is not shown because, in the example shown, there are no massive failures, i.e., four adjacent defective bits in a word.

FIG. 14(f) shows the contents of the GOIDs (bits 0 to 15) that are extracted at the end of each pass. A value of 0 indicates that no failure was detected; a value of 1 indicates that at least one failure was detected since the last GOIDs summary was generated. The GOID for pass 1 shows that both bit 1 and bit 2 as having failed at least once during the execution of the test phases. The GOID for pass 2 bit 1 indicates that bit 1 failed and, similarly, the GOID for pass 2, bit 2 indicates that bit 2 failed. During pass 2, only failures on a single bit were considered during the generation of the column and row summaries. This is done by applying an inactive value to the compare signal (see FIG. 11) of the comparators associated with all other bits of the word. Thus, FIG. 14(c) shows only the defects identified with respect to bit 1 and, similarly, FIG. 14(d) shows only the defects identified with respect to bit 2.

In summary, it will be seen that the present invention provides a method and circuit which overcomes the disadvantages of the known prior art. The method generates memory failure information on-chip and transfers the information off-chip at a tester interface clock rate in real time while performing an at-speed memory tests and provides sufficient information to allow failure bitmaps to be generated. The method avoids the bandwidth problems discussed earlier and requires only a single serial output, avoiding the need to increase in the number of pins or the need for high-speed pins. Further, the method can be used with algorithms that employ column and row access modes and transfers information at the end of testing each column or row, rather than storing the failure information off-chip until the end of a test. The circuit for implementing the method is relatively simple.

Although the present invention has been described in detail with regard to preferred embodiments and drawings of the invention, it will be apparent to those skilled in the art that various adaptions, modifications and alterations may be accomplished without departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

We claim:

1. A method for collecting memory failure information in real time while performing a test of memory embedded in a circuit, comprising, for each column or row of a memory under test the steps of:
   a. successively conducting uninterrupted testing of each memory location of said column or row according to a memory test algorithm under control of a first clock;
   b. selectively generating a failure summary on-circuit while continuing to perform said uninterrupted testing of each memory location of said column or row; and
   c. transferring off-circuit said failure summary from said circuit under control of a second clock concurrently with uninterrupted testing of a next column or row in sequence.

2. A method as defined in claim 1, step c. being initiated upon the later of completion of step a. in respect of said column or row and the completion of step c. in respect of a previous column or row.

3. A method as defined in claim 1, step a. being initiated upon the later of completion of step a. in respect of a previous column or row and the initiation of step c. in respect of such previous column or row.

4. A method as defined in claim 1, wherein step c. comprises transferring said failure summary during a transfer time substantially equal to a time to test a corresponding column or row.

5. A method as defined in claim 4, wherein step b. comprises limiting said failure summary to a bit length substantially equal to or less than said transfer time divided by a period of said second clock.

6. A method as defined in claim 1, wherein step b. comprises the steps of:
   i. if conducting uninterrupted testing of a column of the memory, generating a column failure summary and if conducting uninterrupted testing of a row of the memory, generating a row failure summary, and
   ii. generating -a phase failure summary upon completion of the uninterrupted testing of said column or row.

7. A method as defined in claim 6, wherein each of steps b.i and b.ii comprise: generating at least one column or row failure address, generating at least one failure counts, and generating a failure mask data.

8. A method as defined in claim 7, wherein the step of generating at least one failure mask comprises recording results of bit-wise comparisons between memory data outputs and expected memory data outputs.

9. A method as defined in claim 1, wherein step b. comprises the steps of:
   iii. classifying each detected failure according to predetermined failure types,
   iv. maintaining a count of the number of failures of each of said predetermined failure types, and
   v. recording the count of each said failure types in said failure summary.

10. A method as defined in claim 9, wherein step b.iii. comprises identifying a massive failure type indicative of a predetermined number of failures in adjacent locations in a word of said memory.

11. A method as defined in claim 9, said wherein step b.iii. comprises identifying at least one non-massive failure type selected from a group consisting of a single bit failure type and a multi-bit failure type.

12. A method as defined in claim 9, wherein step b. comprises the step of:
vi. recording a column or row address of each of a first and last failure detected in said column or row, respectively.

13. A method as defined in claim 1, wherein step b. comprises selecting failure summary content based on at least one factor selected from a group consisting of memory test phase and memory access mode.

14. A method as defined in claim 9 wherein step b.vii. comprises maintaining a count of at least one predetermined failure type selected from a group consisting of failed locations, failed locations with massive failures, failed locations with non-massive failures; single-bit failures and multi-bit failures.

15. A method as defined in claim 1, wherein step b. comprises a step of:
vii. concurrently generating at least two failure summaries corresponding to at least two groups of a predetermined number of memory outputs.

16. A method as defined in claim 15, wherein step b.x. comprises concurrently generating a failure summary for each of at least two memories tested in parallel.

17. A method as defined in claim 15, wherein step b.x. comprises generating a failure summary for each of at least two of a memory.

18. A method as defined in claim 15, wherein step c. comprises shifting said at least two failure summaries off-circuit in parallel via corresponding serial outputs of said circuit.

19. A method as defined in claim 15, wherein step b.x. comprises generating a first field identifying a failing group, a second field corresponding to a failure mask of said failing group, and a third field indicating whether the at least one other groups contains failures.

20. A method as defined in claim 19, wherein step b.x. further comprises generating a flag field associated with each of the at least two groups indicating whether group adjacent thereto is also defective.

21. A method as defined in claim 1, wherein step b. comprises generating at least two failure summary fields associated with each of at least corresponding segments of said column or row of said memory and generating a fields relating to the complete column or row.

22. A method as defined in claim 1, wherein step b. comprises the step of:
viii. encoding selected failure information.

23. A method as defined in claim 22, wherein step b.xi. comprises encoding failure counts of each of a set of predetermined failure types when a count of a failure type exceeds a predetermined value associated therewith.

24. A method as defined in claim 23, wherein step b.viii. comprises encoding a percentage of memory locations in a column or row that have failed corresponding to a failure count of at least one of the set of predetermined failure types.

25. A method as defined in claim 23, wherein step b. viii. comprises encoding a count of failures in each of at least two groups of adjacent cells in said column or row.

26. A method as defined in claim 22, wherein step b.xi. comprises encoding a failure mask.

27. A method as defined in claim 26, wherein step b.xi. comprises encoding an index indicative of a failed bit position of a memory output and an indicator of whether the failure mask contains more than one failing bit.

28. A method as defined in claim 1, wherein step b. comprises generating a flag field associated with a column or row address field of a failing cell indicating whether cell adjacent thereto is also defective.

29. A method as defined in claim 1, wherein step b. comprises generating a failure summary only when conducting uninterrupted testing of a column of the memory.

30. A method of collecting memory failure information in real time while performing a test of memory embedded in a circuit for memory test phases that use a column or a row access mode, comprising, for each memory column or row under test:
testing each memory location of said column or row according to a memory test algorithm under control of a first clock;
generating on-circuit a failure summary while testing said column or row, said generating a failure summary including, for each detected failure:
determining whether said detected failure is a massive failure or a non-massive failure; and, if said detected failure is a non-massive failure:
classifying said detected failure according to predetermined failure types; and
updating a failure mask register with results of comparisons of memory outputs and expected memory outputs;
incrementing a count of each detected failure type; and
storing the row or column address of the first and last failures in said column or row, respectively;
upon completion of testing of said column or row, selecting a failure summary data depending upon whether a column or row was tested; and
transferring said failure summary from said circuit under control of said second clock concurrently with testing of the next column or row in sequence.

31. A method as defined in claim 30, said failure summary having a bit length equal to or less than the time required to test a column or row of said memory divided by the period of a second clock.

32. A method as defined in claim 30, further including initiating said transferring said failure summary at the end of testing said column or row or at the end of transferring of an immediately preceding failure summary.

33. A method as defined in claim 32, further including delaying testing of the second next column or row in sequence until said failure summary has been completely transferred.

34. A method as defined in claim 30, further including performing said transferring said failure summary during a transfer time substantially equal to the time required to test a corresponding row or column.

35. A method as defined in claim 30, further including performing said transferring said failure summary during a transfer time equal to or less than the time required to test a corresponding row or column.

36. A method as defined in claim 30, each said failure summary comprising a combination of one or more of a column or row failure address, one or more failure counts, and failure mask data.

37. A method as defined in claim 30, said selectively generating a failure summary further including generating a column failure summary when said algorithm is in column access mode, generating a row failure summary when said algorithm is in row access mode, and, following completion of a test phase, generating a phase failure summary.

38. A method as defined in claim 30, said selectively generating a failure summary including generating a failure summary only when said algorithm is in a column access mode.

39. A memory test controller for testing a memory in a circuit, comprising:
means for conducting testing of each memory location of a column or row of said memory according to a test algorithm under control of a first clock in uninterrupted fashion;
means for generating a failure summary while testing the column or row of said memory; and
means for transferring said failure summary from said circuit via a circuit output under control of a second clock while testing a next column or row, if any, of a memory under test.

40. A memory test controller as defined in claim 39, said means for generating a failure summary including a transfer register for storing failure summary data.

41. A memory test controller as defined in claim 40, said transfer register having a maximum bit length equal to or less than a time to test a column or row of said memory divided by the period of said second clock.

42. A memory test controller as defined in claim 39, said means for generating a failure summary including means responsive to phase input signals and memory access mode signals for selecting failure data to insert into said failure summary.

43. A memory test controller as defined in claim 39, further including failure type identification means responsive to a failure mask for classifying detected failures according to predetermined failure types.

44. A memory test controller as defined in claim 43, said means for generating a failure summary including a counter means for counting detected failures of each of said predetermined failure types.

45. A memory test controller as defined in claim 39, said means for generating a failure summary including failure address registers for storing a row or column address of a first and of a last failure, if any, of a column or row under test.

46. A memory test controller as defined in claim 39, further including a failure mask register for storing results of comparisons of memory data outputs against expected data outputs.

47. A memory test controller as defined in claim 39, further including means for encoding selected failure summary information.

48. A memory test controller as defined in claim 39, said means for encoding selected failure information including means for encoding failure counts of each of at least one predetermined failure types when a count of a failure type exceeds a predetermined value.

49. A memory test controller as defined in claim 48, said means for encoding including means for determining a percentage of the number of defective cells in a column or row.

50. A memory test controller as defined in claim 48, said means for encoding selected failure summary information further including means for maintaining a count of the number of errors in each of at least two groups of adjacent cells in said column or row and including each said count in said failure summary.

51. A memory test controller as defined in claim 47, said means for encoding selected failure summary information including means for encoding failure mask data.

52. A memory test controller as defined in claim 47, said means for encoding selected failure summary information including means for providing an index to identify a bit position of a memory output that failed and an indicator of whether a failure mask contains more than one failing bit.

53. A memory test controller as defined in claim 39, said means for generating a failure summary including:
a failure type identification circuit for determining to which of a set of predetermined failure types each detected failure corresponds;
a failure type counter for each of said predetermined failure type;
a failure mask register for storing results of bit-wise comparisons between each memory output and corresponding expected memory outputs;
failure address registers for storing a row or column address of each of first and last failure in a column or row;
a failure summary selection circuit for determining content of said failure summary, and
a failure summary transfer register for holding said failure summary and;
a circuit for controlling shifting of failure data into and out of said transfer register.

54. A memory test controller for testing memory in a circuit, comprising:
means for testing each memory location of a column or row of a memory under test according to a test algorithm under control of a first clock;
a failure summary generator for generating a failure summary while testing a column or row of said memory, including:
failure type identification means responsive to a failure mask for classifying detected failures according to predetermined failure types;
counter means responsive to outputs of said failure type identification means for counting failures of each said predetermined types;
failure address registers for storing the row or column address of first and last detected failures in a column or row under test; and
a failure mask register for storing a failure mask containing results of comparisons of memory data outputs against expected data outputs;
means responsive to phase input signals and memory access mode signals for selecting failure data to insert into said failure summary a failure summary transfer register having a bit length equal to or less than the time required to test a column or row of said memory divided by the period of said second clock; and
means for transferring said failure summary from said circuit via a circuit serial output under control of a second clock while testing the next column or row, if any, of a memory under test.

* * * * *